(12) United States Patent
Huang et al.

(10) Patent No.: US 7,788,568 B1
(45) Date of Patent: Aug. 31, 2010

(54) SYSTEM AND METHOD FOR CHARACTERIZING ERROR CORRECTION PERFORMANCE FOR DIGITAL DATA TRANSPORT OVER AN IP NETWORK

(75) Inventors: Renxiang Huang, Sunnyvale, CA (US); Claudio Lima, San Jose, CA (US); Jim Black, San Francisco, CA (US)

(73) Assignee: Sprint Communications Company L.P., Overland Park, KS (US)

( * ) Notice: Subject to any disclaimer, the term of this patent is extended or adjusted under 35 U.S.C. 154(b) by 1257 days.

(21) Appl. No.: 11/337,367

(22) Filed: Jan. 23, 2006

(51) Int. Cl.
*H03M 13/00* (2006.01)
(52) U.S. Cl. ........................ 714/774; 709/224
(58) Field of Classification Search ............ 714/774, 714/746, 752, 781; 709/224
See application file for complete search history.

(56) References Cited

U.S. PATENT DOCUMENTS

| | | | |
|---|---|---|---|
| 6,480,892 B1 * | 11/2002 | Levay et al. | 709/224 |
| 6,981,200 B2 * | 12/2005 | Maung et al. | 714/781 |
| 7,577,898 B2 * | 8/2009 | Costa et al. | 714/776 |
| 2006/0059400 A1 * | 3/2006 | Clark et al. | 714/752 |
| 2009/0055715 A1 * | 2/2009 | Jashek et al. | 714/776 |

* cited by examiner

*Primary Examiner*—Sam Rizk

(57) ABSTRACT

A method for characterizing performance of an error correction scheme for digital data transport is provided. A digital data packet stream within an Internet Protocol packet stream is monitored for a first set of packet errors. Errors of the Internet Protocol packet stream are corrected according to the error correction scheme to produce a corrected Internet Protocol packet stream. The digital data packet stream within the corrected Internet Protocol packet stream is monitored for a second set of packet errors. The first and second sets of packet errors are compared to characterize the performance of the error correction scheme.

26 Claims, 7 Drawing Sheets

SYSTEM AND METHOD FOR CHARACTERIZING ERROR CORRECTION PERFORMANCE FOR DIGITAL DATA TRANSPORT OVER AN IP NETWORK

RELATED APPLICATIONS

Not applicable.

FEDERALLY SPONSORED RESEARCH OR DEVELOPMENT

Not applicable.

MICROFICHE APPENDIX

Not applicable.

BACKGROUND OF THE INVENTION

1. Field of the Invention

Aspects of the invention relate generally to data communication over Internet Protocol (IP) communication systems, and more particularly to characterizing the performance of error correction of data communication over IP communication systems.

2. Description of the Prior Art

Previously, digital video transmission over networks has been accomplished by way of dedicated, private connections involving Asynchronous Transfer Mode and similar methods to help guarantee a desired Quality of Service (QoS). More specifically, private or dedicated networks often provide the low packet loss and limited latency desired for streaming video transmissions.

However, private networks dedicated for video communication tend to be expensive to configure and operate. As a result, many organizations have migrated to the use of Internet Protocol (IP) networks for their digital video transmission needs. While costs are reduced as a result, IP networks typically are not designed with the goal of maintaining a QoS acceptable for video data. Packet loss, latency, jitter and other maladies associated with IP networks often wreak havoc with digital video transmission over IP.

To counteract at least some of these problems, video transmissions often employ a forward error correction (FEC) scheme to reduce the amount of packet loss. FIG. 1 provides a simplified block diagram of a video transmission system 1 employing FEC. The system 1 includes a video encoder 2, an FEC encoder 4, an IP network 6, an FEC decoder 8, and a video decoder 10. The video encoder 2 encodes a digital video input signal 12 into a digital video packet stream compatible with the IP network 6. In some cases, the digital video packet stream complies with one of the Motion Picture Experts Group (MPEG) standards, such as the MPEG-2 Transport Stream (TS) format. Further, the video encoder 2 encapsulates the MPEG-2 TS packets within an IP packet stream for transfer over the IP network 6. Typically, the IP packet stream is embodied as a Real-time Transport Protocol (RTP) over IP packet stream, or a User Datagram Protocol (UDP) over IP packet stream.

The FEC encoder 4 then generates one or more IP packets providing data redundancy for error correction of the IP packets containing the digital video packets. More specifically, the error correction IP packets are typically generated from the data in the digital video packets according to a mathematical algorithm, and then subsequently used in conjunction with a companion algorithm to correct errors in the digital video packets. One example of forward error correction for video data is discussed in "Pro-MPEG Code of Practice #3, Release 2" (2004), provided by the Pro-MPEG Forum, incorporated herein by reference in its entirety. The IP packets carrying the digital video data stream packets, as well as the error correction IP packets, are then transferred over the IP network 6 to a destination.

At the destination, the FEC decoder 8 decodes the error correction IP packets in accordance with the error correction scheme to correct errors in the IF packets carrying the digital video packet stream. The IP packets of the corrected digital video packet stream are then forwarded to the video decoder 10, which decodes the digital video packet stream to produce an output video signal 14.

Many different error correction schemes are available for video transport. Thus, the ability to characterize the performance of one or more of the error correction schemes under a variety of operating conditions, especially with respect to random loss protection, would be advantageous for selecting a scheme appropriate for the particular application involved. Unfortunately, most testing equipment available for monitoring IP packets are only connectable within the destination at the input to the FEC decoder 8, and thus are not positioned to measure the performance of the IP error correction scheme after the IP packets have been corrected. Also, most video decoders 10 receive IP packets as input, but produce MPEG-2 TS packets at one of its outputs, thus prohibiting analysis of the effectiveness of the IP error correction scheme at that point.

SUMMARY OF THE INVENTION

One embodiment of the invention, described below, provides a method for characterizing the performance of an error correction scheme for transport of digital data. The method includes monitoring a digital data packet stream within an Internet Protocol packet stream for a first set of packet errors. Errors of the Internet Protocol packet stream are corrected according to the error correction scheme, thereby producing a corrected Internet Protocol packet stream. The digital data packet stream within the corrected Internet Protocol packet stream is then monitored for a second set of packet errors. The first and second sets of packet errors are then compared to characterize the performance of the error correction scheme.

Another embodiment provides a system for characterizing the performance of an error correction scheme for transport of digital data. Included in the system is a first digital data tester configured to monitor a digital data packet stream within an Internet Protocol packet stream for a first set of packet errors. An error correction decoder is configured to correct errors of the Internet Protocol packet stream according to the error correction scheme to produce a corrected Internet Protocol packet stream. Also included is a second digital data tester configured to monitor the digital data packet stream within the corrected Internet Protocol packet stream for a second set of packet errors. A processor is configured to compare the first and second set of packet errors to characterize the performance of the error correction scheme.

Additional embodiments and advantages of the present invention will be ascertained by those skilled in the art upon perusal of the following detailed description, taken in conjunction with the accompanying drawings.

DETAILED DESCRIPTION OF THE INVENTION

Figure 1:
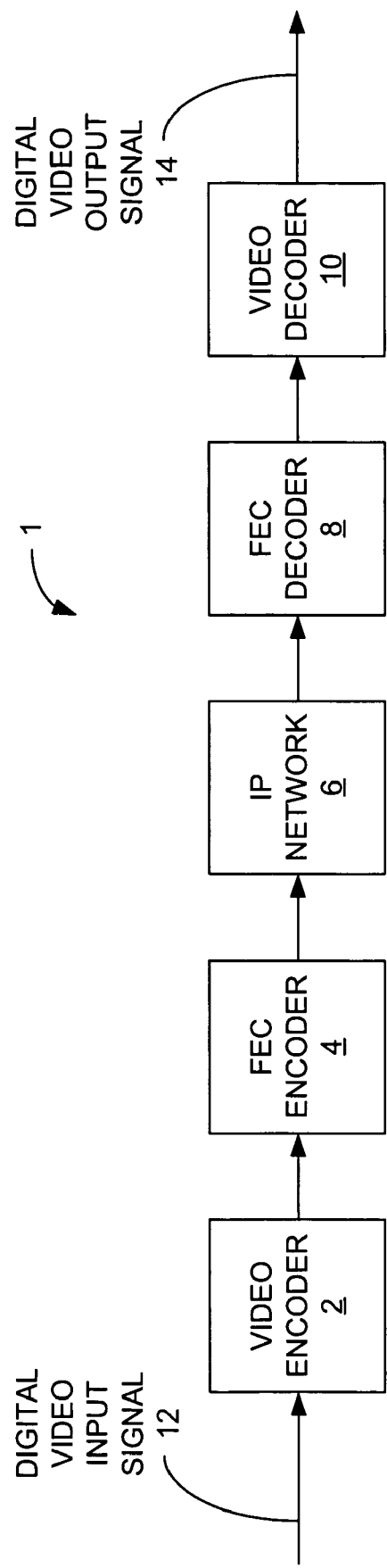
FIG. 1 is a simplified block diagram of a video transmission system from the prior art.
Figure 2:
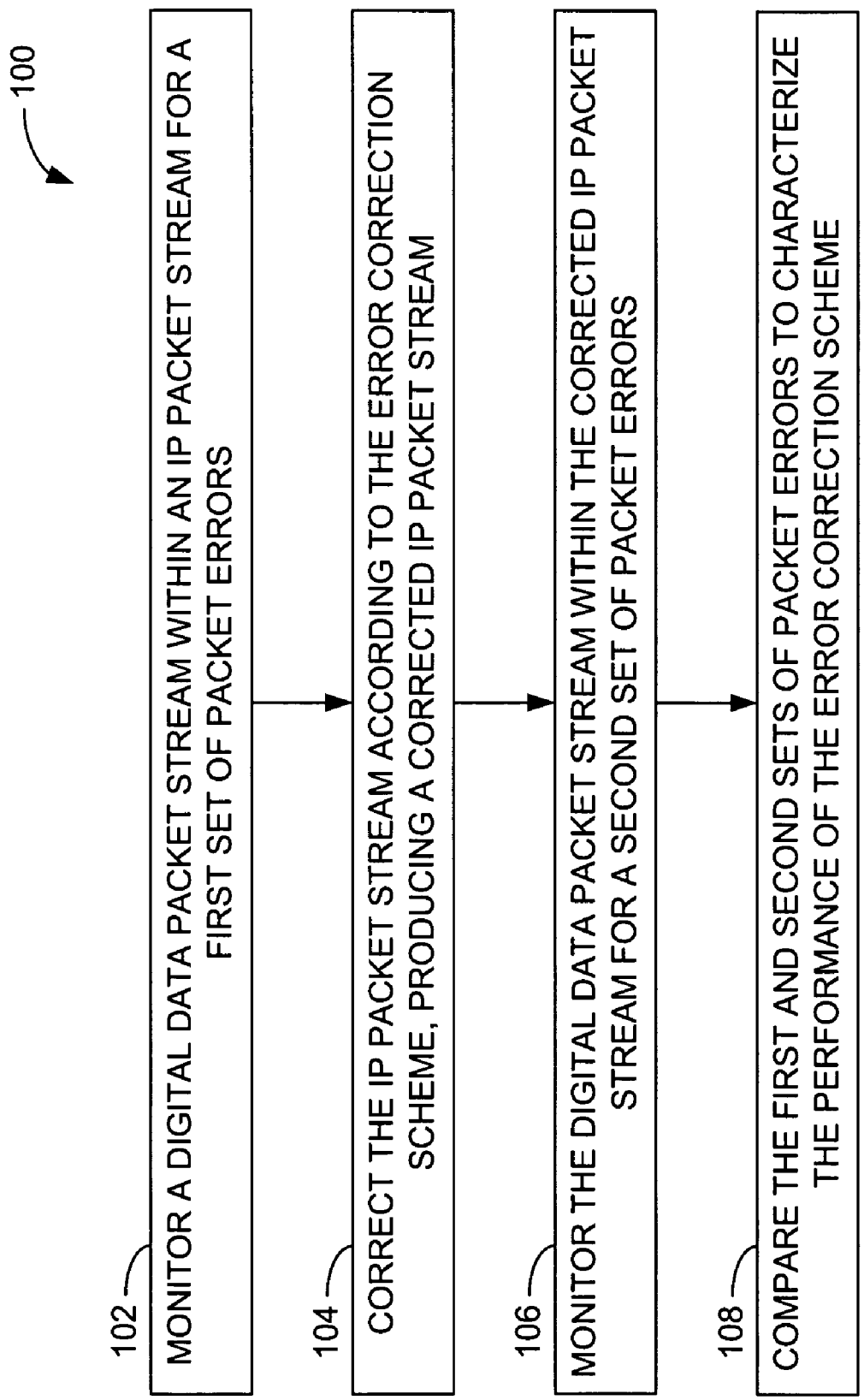
FIG. 2 is a flow diagram of a method for characterizing the performance of an error correction scheme for transport of digital data according to an embodiment of the invention.

FIG. 2 provides a flow diagram of a method 100 for characterizing the performance of an error correction scheme for digital data transport according to an embodiment of the invention. The method 100 includes monitoring a digital data packet stream within an Internet Protocol packet stream for a first set of packet errors (operation 102). The errors of the Internet Protocol packet stream are corrected according to the error correction scheme, thus producing a corrected Internet Protocol packet stream (operation 104). The digital data packet stream within the corrected Internet Protocol packet stream is monitored for a second set of packet errors (operation 106). The first and second sets of packet errors are then compared to characterize the performance of the error correction scheme (operation 108).

Figure 3:
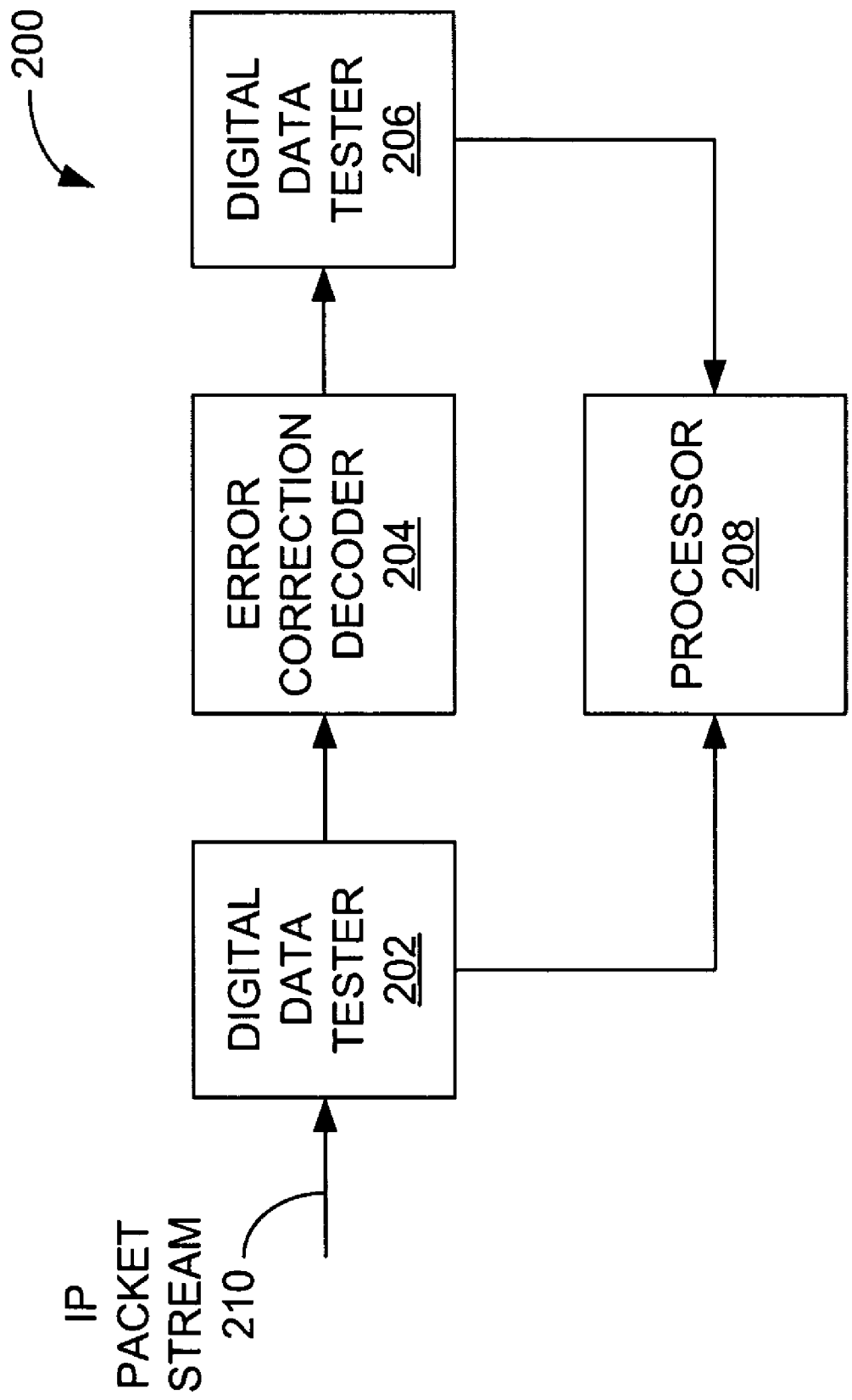
FIG. 3 is a block diagram of a system for characterizing the performance of an error correction scheme for transport of digital data according to an embodiment of the invention.

FIG. 3 presents a block diagram of a system 200 for characterizing the performance of an error correction scheme for digital data transport according to another embodiment of the invention. A first digital data tester 202 is configured to monitor a digital data packet stream within an Internet Protocol packet stream 210 for a first set of packet errors. Also included is an error correction decoder 204 configured to correct errors of the Internet Protocol packet stream 210 according to the error correction scheme to produce a corrected Internet Protocol packet stream. A second digital data tester 206 is configured to monitor the digital data packet stream within the corrected Internet Protocol packet stream for a second set of packet errors. A processor 208 is configured to compare the first and second sets of packet errors to characterize the performance of the error correction scheme.

Figure 4:
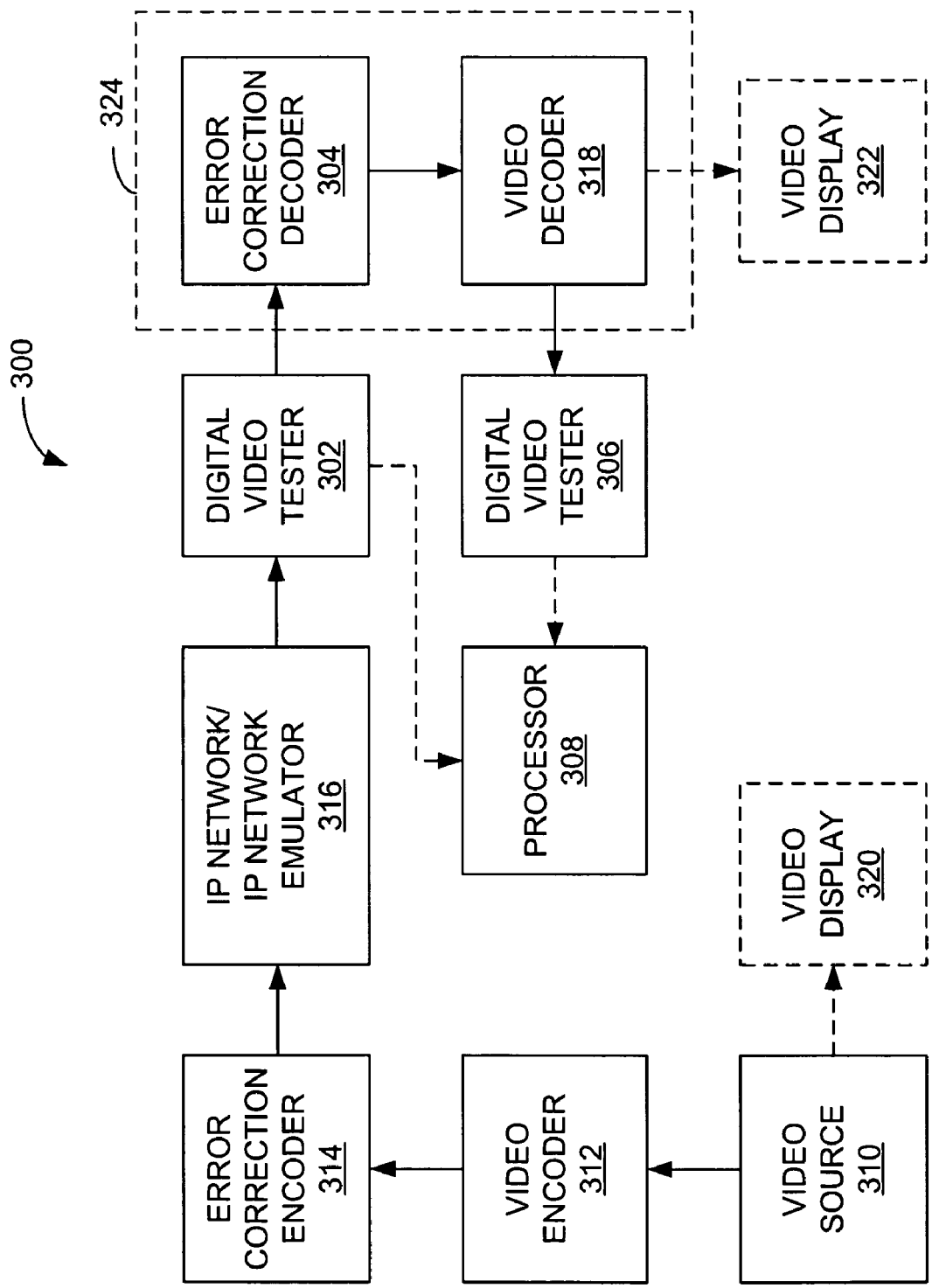
FIGS. 4 and 4A each present a block diagram of a system for characterizing the performance of an error correction scheme for transport of digital video data according to another embodiment of the invention.
Figure 5:
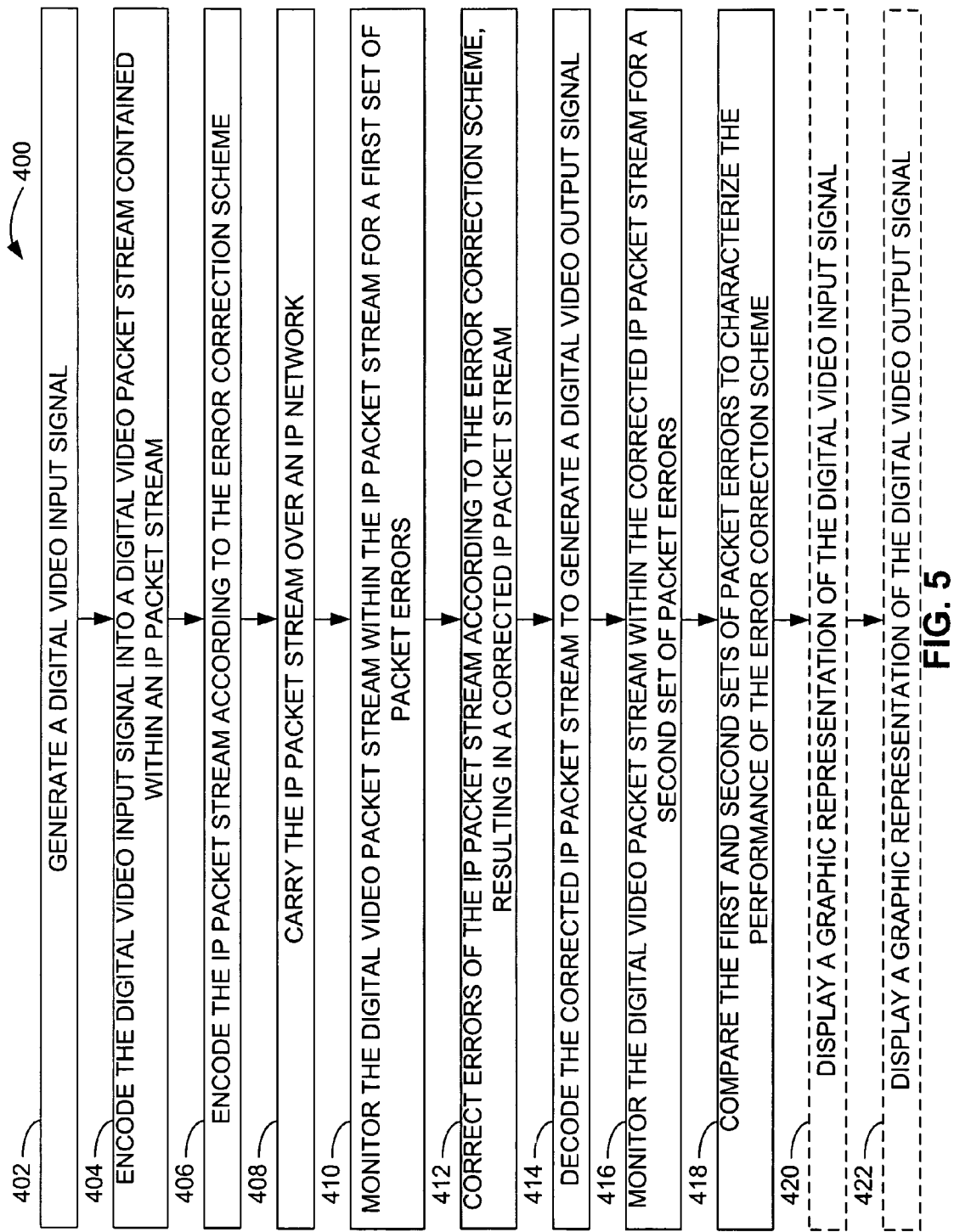
FIG. 5 is a flow diagram of a method for characterizing the performance of an error correction scheme for transport of digital video data according to another embodiment of the invention.

A block diagram of another embodiment of the invention, a system 300 for characterizing the performance of an error correction scheme for digital video data transport, is presented in FIG. 4. Also, FIG. 5 provides a method 400 of characterizing error correction scheme performance in conjunction with the system 300, although other systems may be employed which perform the method 400 operations discussed below. Also, while the embodiments discussed below specifically address the communication of digital video data, other forms of data transported over an IP network may also benefit from application of the various embodiments presented.

The system 300 includes a video source 310, a video encoder 312, an error correction encoder 314, an IP network or IP network emulator 316, a first digital video tester 302, an error correction decoder 304, a video decoder 318, a second digital video tester 306, and a processor 308. In addition, a first video display 320 and a second video display 322 may provided.

The video source 310 is configured to generate a digital video input signal for the video encoder 312 (operation 402). In one embodiment, the video source 310 is coupled with the video encoder 312 via a Serial Digital Interface (SDI) carrying uncompressed digital video data. Generally, SDI is a professional-grade digital interface for carrying data between video equipment, such as that employed in a television studio. In another implementation, the video source 310 is coupled with the video encoder 312 by way of an Asynchronous Serial Interface (ASI). In that situation, the digital video input signal may be a compressed digital video signal, such as a compressed MPEG-2 signal. In one implementation, the video source 310 is a video server. Also, the video source 310 may be coupled to the first video display 320 by way of a component video output or other standard video output for display to a user (operation 420). In the case the first video display 320 is a high-definition display, the video source 310 may be coupled with the first video display 320 by way of an SDI. In other embodiments, a component video output, a Digital Video Interface (DVI) or a High-Definition Multimedia Interface (HDMI) may couple the video source 310 and the first video display 320.

The video encoder 312 is configured to encode the digital video input signal into a digital video packet stream contained within an Internet Protocol packet stream (operation 404). As a result, in one embodiment the video encoder 312 generates an MPEG-2 Transport Stream (TS) contained within a stream of IP packets for ultimate transfer over the IP network 316. The video encoder 312 forwards the IP packet stream to the error correction encoder 314. In one embodiment, the video encoder 312 and the error correction encoder 314 are coupled together using an ASI, as described above.

Further, the IP packet stream may be, in one example, a Real-time Transport Protocol (RTP) over IP packet stream. In another implementation, the IP packet stream is a User Datagram Protocol (UDP) over IP packet stream. RTP over IP generally supports detection of lost packets, as well as content identification and timing reconstruction. Detection of lost packets may occur via packet sequence numbers provided in the RTP over IP packets. UDP over IP, on the other hand, is a simple, connectionless protocol providing no error recovery services.

The error correction encoder 314 is configured to encode the IP packet stream according to the error correction scheme supported by the error correction encoder 314 (operation 406). In one embodiment, the error correction encoder 314 produces error correction IP packets placed within the IP packet stream, which the encoder 314 then forwards over the IP network 316. In one embodiment, the error correction scheme implemented by the error correction encoder 314 and the error correction decoder 304 is based on a bitwise-exclusive-OR (XOR) operation within a data frame consisting of a number of IP packets arranged in rows and columns. In that case, the XOR operation occurs along all IP packets of each column of a data frame to generate an error correction IP packet associated with each column. This particular error correction scheme is explained in the "Pro-MPEG Code of Practice #3, Release 2" (2004), mentioned above. Many other possible error correction schemes, such as those involving Reed-Solomon (RS) error correction codes (ECC), may be employed in the alternative.

The IP network 316 carrying the IP packet stream may embrace any of several configurations. In one example, the IP network 316 may include portions of the Internet for a longdistance transport of the IP packet stream to produce conditions typically experienced in many IP-based video communication systems. In another implementation, the IP network 316 may be a network emulator capable of introducing data errors into the IP packets traversing the emulator. Such an emulator may provide the capability to introduce delay, jitter, and packet loss into the IP packet stream in a controlled manner. In that case, the entire system 300 may reside within a single room or building, thus allowing greater control of the operating conditions under which the characterization of the error correction scheme is performed. The network emulator may be coupled with the error correction encoder 314 and the first digital video tester 302 by way of Ethernet connections. One particular example of a network emulator is the Packet-Storm IP Network Emulator, manufactured by PacketStorm Communications, Inc.

The IP packet stream is then carried by way of the IP network or network emulator 316 to a first digital video tester 302 (operation 408), which is configured to monitor the digital video packet stream within the IP packet stream for packet errors (operation 410). In one embodiment, wherein the digital video packet stream is an MPEG-2 Transport Stream (TS), the digital video tester 302 monitors the "continuity counter" field of the header portion of each MPEG-2 TS packet within each of the IP packets. This counter is a modulo-16 counter which is incremented for each packet of the TS in chronological order. Thus, under normal circumstances, if the packets are being received correctly and in the proper order, the continuity counter will produce a sequence beginning with zero, incrementing up through fifteen, returning to zero, and counting up again repeatedly. Interruptions in this sequence indicate an error with at least one packet of the MPEG-2 TS.

In one implementation, the first digital video tester 302 is capable of adhering to the digital video broadcast measurement guidelines set forth in the European Telecommunications Standards Institute (ETSI) Technical Report 290 (ETR 290) (May 1997), especially with respect to errors indicated by the continuity counter. For example, the first digital video tester 302 may be able to detect when the continuity counts of the TS packets are out of order, if a particular count is missing, or if a count is duplicated. In any or all of these cases, the tester 302 may indicate a packet error accordingly. One possible tester available for such a purpose is the Singulus™ G1-T by IneoQuest Technologies, Inc.

In one embodiment, the first digital video tester 302 is configured to operate in a "passthrough" mode. As a result, the monitoring performed by the tester 302 does not substantively modify or alter the IP packets passing through the tester 302. Also, in the case a network emulator is employed for the IP network 316, the first digital video tester 302 is coupled to both the network emulator 316 and the error correction decoder 304.

The IP packet stream leaving the first digital video tester 302 is received by the error correction decoder 304, which is configured to employ the IP error correction packets generated by the error correction encoder 314 to correct errors in the IP packets carrying the digital video packet stream, resulting in a corrected IP packet stream (operation 412). The corrected IP packet stream is then delivered to the video decoder 318, possibly by way of an ASI.

The video decoder 318 is configured to decode the corrected IP packet stream to generate a digital video output signal (operation 414). In one embodiment, the digital video output signal includes the packets of the MPEG-2 TS, which may be transferred by way of ASI to the second video display 322 for presentation to a user (operation 422). In another example, the digital video output signal is an uncompressed digital video signal transmitted by SDI or other suitable interface to the second video display 322, which may be a standard definition or High-Definition display. By way of the first video display 320 and the second video display 322, a qualitative comparison thus may be made of the original video signal and the resulting video signal after transport over the IP network 316 and subsequent error correction for the purpose of visual performance characterization.

Also coupled to the video decoder 318, possibly by way of an ASI, is the second digital video tester 306, which is configured to monitor the digital video packet stream of the corrected IP packet stream for packet errors (operation 416). In one embodiment, the second tester 306 uses the MPEG-2 TS continuity counts to determine errors, as discussed above in relation to the first tester 302. Also, the second tester 306 is an ETR-290-compliant tester, such as the MTM-400 MPEG Transport Stream Monitor, provided by Tektronix, Inc. In some cases, the error correction decoder 304 and the video decoder 318 may be housed within a single enclosure 324, thus preventing the use of a "passthrough" tester, such as the first digital video test 302, between the error correction decoder 304 and the video decoder 318. In another embodiment, a system 300A illustrated in FIG. 4A, a second tester 306a may be a Singulus™ G1-T by IneoQuest Technologies, Inc. coupled between the error correction decoder 304 and the video decoder 318 in passthrough mode by way of Ethernet.

Figure 4A:
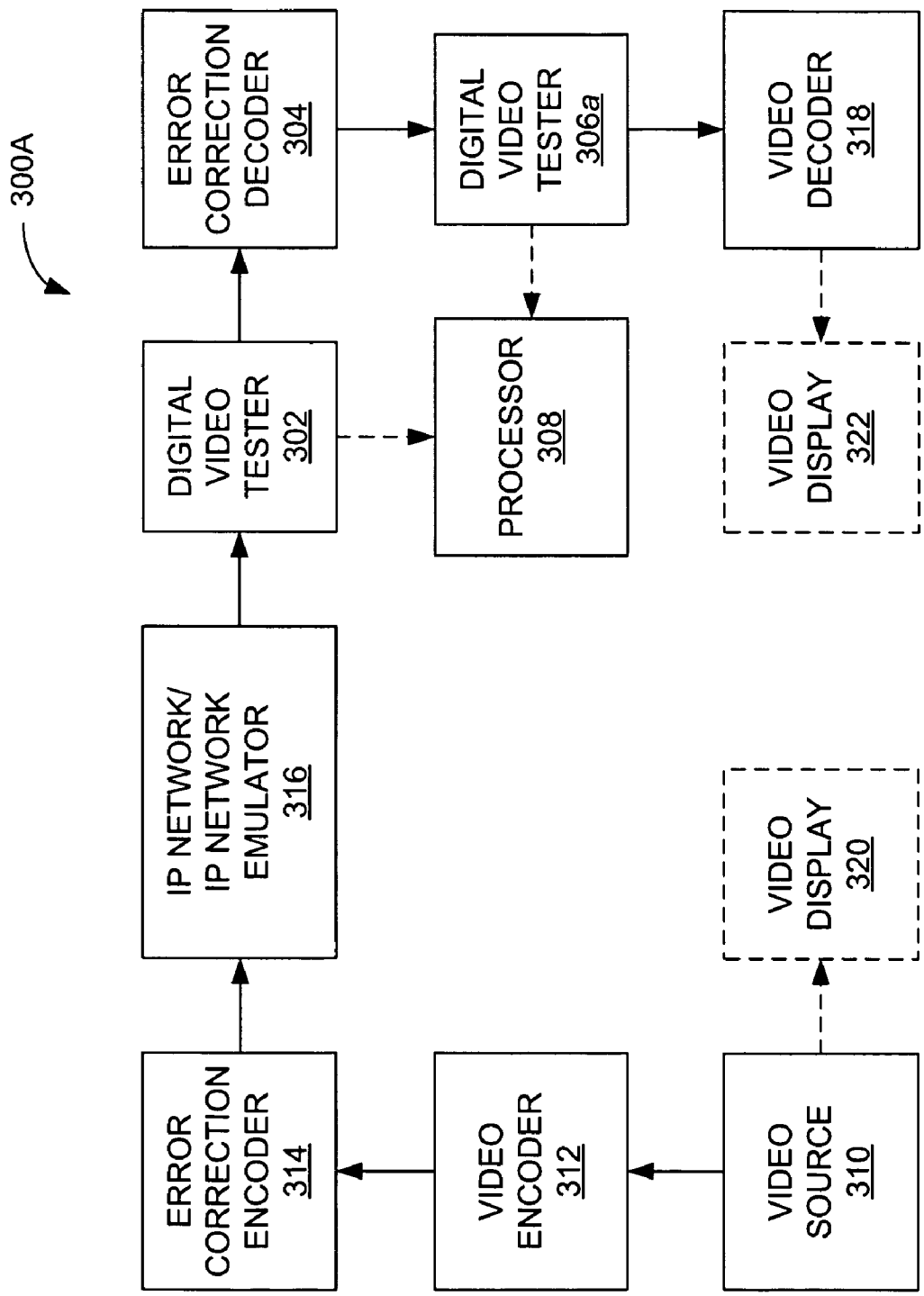

A processor 308 may then be employed to compare the first set of packet errors determined by the first digital video tester 302 and the second set of packets determined by the second digital video tester 306, 306a to characterize the performance of the error correction scheme (operation 418). In one implementation, the processor 308 is coupled directly to the first and second digital video testers 302, 306, 306a as shown in FIGS. 4 and 4A. In other examples, the processor 308 may be programmed to receive data from the testers 302, 306, 306a manually by way of human intervention. In one embodiment, the characterization task is performed by calculating a first IP packet loss ratio (IPLR) for the IP packet stream using the first set of packet errors, calculating a second IPLR for the corrected IP packet stream using the second set of packet errors, and then calculating a ratio of the first and second IPLR to obtain a value indicative of the performance of the error correction scheme.

In one embodiment, the IPLR is calculated using errors determined from the continuity count of the MPEG-2 TS packets. More specifically, according to the following equation:

$$IPLR = (8 = CC \times S)/(R_b \times N \times T)$$

wherein:
IPLR=the IP packet loss ratio;
CC=the number of continuity count errors;
S=the IP packet size in bytes;
$R_b$×the packet stream bit rate in bits per second (bps);
N=the number of MPEG-2 TS packets per IP packet; and
T=the total test time in seconds (sec).

In the above equation, 8 is a factor for converting a number of bytes into a number of bits. Also, the number of MPEG-2 TS packets per IP packets, designated by the variable N, is normally seven, although some video encoders may employ just one MPEG-2 TS packet per IP packet. Other values for N may be utilized as well.

Figure 6:
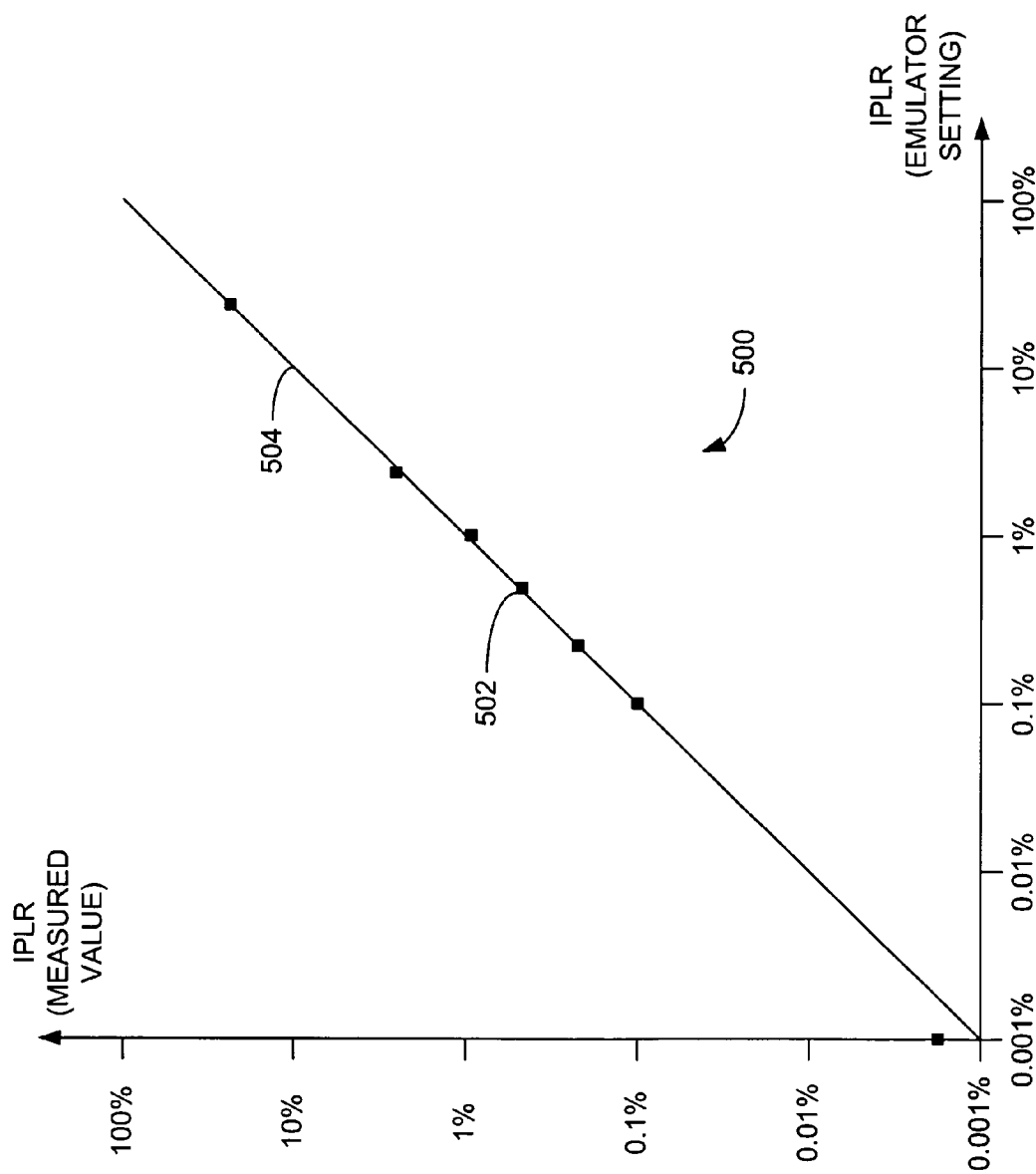
FIG. 6 is a graph comparing an Internet Protocol packet loss ratio as generated by an IP network emulator with an Internet Protocol packet loss ratio as measured according to an embodiment of the invention.

By way of the above equation, the continuity count of the MPEG-2 TS packets is employed as a surrogate for a direct measurement of IP packet loss, and thus provides an indication of the performance or effectiveness of the IP error correction scheme being employed at the IP level. A graph 500 shown in FIG. 6 employs a logarithmic-logarithmic scale to compare the IPLR as calculated using continuity count errors (datapoints 502 depicted with squares) related to several different IPLR settings of a PacketStorm emulator responsible for creating the errors detected. A straight line 504 denotes the expected values for the IPLR. In this particular case, T=180 sec, N=7, S=1374 bytes, and $R_b$=20 megabits per second (Mbps). The graph 500 shows close agreement between the measured values and the expected values over several decades, thus indicating the validity of the particular measurement methodology described herein.

Thus, use of various embodiments as discussed herein provides the capability to accurately characterize the performance of an error correction scheme without directly accessing IP-level information. This utility is especially useful in cases where sequence information provided by way of a high-level protocol, such as RTP, is not accessible due to limitations in available hardware connections. Also, in the event UDP is employed, the use of MPEG-2 TS continuity count information is desirable due to the lack of sequence information provided by UDP.

However, in an embodiment in which the IP packet stream is an RTP over IP packet stream, the sequence numbers of the RTP packets, if available, may be employed in a fashion similar to those of the MPEG-2 TS continuity counts discussed above. More specifically, the RTP sequence numbers may be monitored both before and after error correction of the IP packets to detect packet loss. The difference between packet loss before error correction and after error correction may then be analyzed to determine the effectiveness of the particular error correction scheme employed.

The performance characterization methods described above may be implemented in electronic hardware, software, or some combination thereof. Also, such software may be executed on a single processing system, such as a general-purpose computing system, a special-purpose processing system, and the like, or on multiple processors operably coupled together.

While several embodiments of the invention have been discussed herein, other embodiments encompassed within the scope of the invention are possible. For example, while particular mention has been made of several different networking protocols normally employed with respect to video transport, such as RTP, UDP, and MPEG-2 TS, other embodiments of the invention may be employed in conjunction with other network protocols protected by an error correction scheme. Also, while some embodiments of the present invention may be motivated by the transport of digital video data over an IP network, the communication of other forms of data, including but not limited to audio, textual and numerical data, may also be the focus of other embodiments. In addition, aspects of one embodiment may be combined with aspects of other embodiments disclosed above to produce additional embodiments not heretofore discussed. Thus, while the present invention has been described in the context of specific embodiments, such descriptions are provided for illustration and not limitation. Accordingly, the proper scope of the present invention is delimited only by the following claims.

What is claimed is:

1. A method for characterizing performance of an error correction scheme for transport of digital video data, comprising:
   monitoring a digital video data packet stream comprising transport stream packets of the digital video data within an Internet Protocol packet stream for a first set of continuity count errors of the transport stream packets;
   correcting errors of the Internet Protocol packet stream according to the error correction scheme, thus producing a corrected Internet Protocol packet stream;
   monitoring the digital data packet stream within the corrected Internet Protocol packet stream for a second set of continuity count errors of the transport stream packets; and
   comparing the first set of continuity count errors and the second set of continuity count errors to characterize the performance of the error correction scheme.

2. The method of claim 1, wherein correcting errors of the Internet Protocol Packet stream comprises decoding error correction packets within the Internet Protocol packet stream to correct the errors in the Internet Protocol packet stream.

3. The method of claim 1, wherein the transport stream packets are encoded under Motion Picture Experts Group Standard 2.

4. The method of claim 1, wherein the continuity count errors comprise an incorrect order of the transport stream packets.

5. The method of claim 1, wherein the continuity count errors comprise a missing transport stream packet.

6. The method of claim 1, wherein the continuity count errors comprise a duplicate transport stream packet.

7. The method of claim 1, wherein comparing the first set of packet errors and the second set of packet errors comprises:
   calculating an Internet Protocol packet loss ratio of the Internet Protocol packet stream using the first set of packet errors;
   calculating a corrected Internet Protocol packet loss ratio of the corrected Internet Protocol packet stream using the second set of packet errors; and
   calculating a ratio of the Internet Protocol packet loss ratio and the corrected Internet Protocol packet loss ratio to characterize the performance of the error correction scheme.

8. The method of claim 1, wherein the Internet Protocol packet stream comprises a Real-time Transport Protocol over Internet Protocol packet stream.

9. The method of claim 1, wherein the Internet Protocol packet stream comprises a User Datagram Protocol over Internet Protocol packet stream.

10. The method of claim 1, further comprising:
    generating a digital video input signal;
    encoding the digital video input signal into the digital video packet stream within the Internet Protocol packet stream;
    encoding the Internet Protocol packet stream according to the error correction scheme;
    carrying the Internet Protocol packet stream over an Internet Protocol network; and
    decoding the corrected Internet Protocol packet stream to generate a digital video output signal.

11. The method of claim 10, wherein the Internet Protocol network comprises an Internet Protocol network emulator.

12. The method of claim 10, further comprising:
    displaying a graphic representation of the digital video input signal; and
    displaying a graphic representation of the digital video output signal.

13. A digital storage medium comprising instructions executable on a processor for employing the method of claim 1.

14. A system for characterizing performance of an error correction scheme for transport of digital video data, comprising:
    a first digital video data tester configured to monitor a digital data packet stream comprising transport stream packets of the digital video data within an Internet Protocol packet stream for a first set of continuity count errors of the transport stream packets;
    an error correction decoder configured to correct errors of the Internet Protocol packet stream according to the error correction scheme, thus producing a corrected Internet Protocol packet stream;

a second digital video data tester configured to monitor the digital data packet stream within the corrected Internet Protocol packet stream for a second set of continuity count errors of the transport stream packets; and a processor configured to compare the first set of continuity count errors and the second set of continuity count errors to characterize the performance of the error correction scheme.

15. The system of claim 14, wherein the error correction decoder is further configured to decode error correction packets within the Internet Protocol packet stream to correct the errors in the Internet Protocol packet stream.

16. The system of claim 14, wherein the transport stream packets of the digital video data are encoded under Motion Picture Experts Group Standard 2.

17. The system of claim 14, wherein the continuity count errors comprise an incorrect order of the transport stream packets.

18. The system of claim 14, wherein the continuity count errors comprise a missing transport stream packet.

19. The system of claim 14, wherein the continuity count errors comprise a duplicate transport stream packet.

20. The system of claim 14, wherein the processor is further configured to:
    calculate an Internet Protocol packet loss ratio of the Internet Protocol packet stream using the first set of packet errors;
    calculate a corrected Internet Protocol packet loss ratio of the corrected Internet Protocol packet stream using the second set of packet errors; and
    calculate a ratio of the Internet Protocol packet loss ratio and the corrected Internet Protocol packet loss ratio to characterize the performance of the error correction scheme.

21. The system of claim 14, wherein the Internet Protocol packet stream comprises a Real-time Transport Protocol over Internet Protocol packet stream.

22. The system of claim 14, wherein the Internet Protocol packet stream comprises a User Datagram Protocol over Internet Protocol packet stream.

23. The system of claim 14, further comprising:
    a video source configured to generate a digital video input signal;
    a video encoder configured to encode the digital video input signal into the digital video packet stream within the Internet Protocol Packet stream;
    an error correction encoder configured to encode the Internet Protocol packet stream according to the error correction scheme;
    an Internet Protocol network configured to carry the Internet Protocol packet stream to the first digital data tester; and
    a video decoder coupled with the error correction decoder, the video decoder being configured to decode the corrected Internet Protocol packet stream to generate a digital video output signal.

24. The system of claim 23, wherein the Internet Protocol network comprises an Internet Protocol network emulator coupled to the error correction encoder by way of a first Ethernet connection and to the second digital data tester by way of a second Ethernet connection.

25. The system of claim 23, further comprising:
    a first video display coupled with the video source and configured to display a graphic representation of the digital video input signal; and
    a second video display coupled with the video decoder and configured to display a graphic representation of the digital video output signal.

26. A system for characterizing performance of an error correction scheme for transport of digital video data, comprising:
    means for monitoring a digital video data packet stream comprising transport stream packets of the digital video data within an Internet Protocol packet stream for a first set of continuity count errors of the transport stream packets;
    means for correcting errors of the Internet Protocol packet stream according to the error correction scheme, thus producing a corrected Internet Protocol packet stream;
    means for monitoring the digital data packet stream within the corrected Internet Protocol packet stream for a second set of continuity count errors of the transport stream packets; and
    means for comparing the first set of continuity count errors and the second set of continuity count errors to characterize the performance of the error correction scheme.

* * * * *